(12) United States Patent
Obata

(10) Patent No.: US 10,622,942 B2
(45) Date of Patent: Apr. 14, 2020

(54) OSCILLATOR, ELECTRONIC APPARATUS, AND VEHICLE

(71) Applicant: SEIKO EPSON CORPORATION, Tokyo (JP)

(72) Inventor: Naohisa Obata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/286,789

(22) Filed: Feb. 27, 2019

(65) Prior Publication Data

US 2019/0267941 A1  Aug. 29, 2019

(30) Foreign Application Priority Data

Feb. 28, 2018  (JP) .................... 2018-035890

(51) Int. Cl.
| | | |
|---|---|---|
| *H03B 5/04* | (2006.01) | |
| *H03B 5/32* | (2006.01) | |
| *H03H 9/19* | (2006.01) | |
| *H03H 9/05* | (2006.01) | |
| *H03L 1/02* | (2006.01) | |
| *H03L 1/04* | (2006.01) | |

(52) U.S. Cl.
CPC .............. *H03B 5/04* (2013.01); *H03B 5/32* (2013.01); *H03H 9/0523* (2013.01); *H03H 9/0533* (2013.01); *H03H 9/19* (2013.01); *H03L 1/02* (2013.01); *H03L 1/028* (2013.01); *H03L 1/04* (2013.01)

(58) Field of Classification Search
CPC .... H03B 5/04; H03B 5/02; H03B 5/32; H03L 1/028; H03L 1/02; H03L 1/04; H03H 9/02102; H03H 9/17; H03H 9/19; H03H 9/02448; H03H 9/0547; H03H 9/0552; H03H 9/08; H03H 9/0514; H03H 9/055
See application file for complete search history.

(56) References Cited

U.S. PATENT DOCUMENTS 9,287,881 B2 * 3/2016 Shimodaira ............... H03H 9/17
2017/0373637 A1 * 12/2017 Kondo ............... H03H 9/02102

FOREIGN PATENT DOCUMENTS

| JP | 2010-141415 A | | 6/2010 |
|---|---|---|---|
| JP | 2010177732 A | * | 8/2010 |
| JP | 2016-103758 A | | 6/2016 |
| WO | 2017/110727 A1 | | 6/2017 |

* cited by examiner

*Primary Examiner* — Ryan Johnson
(74) *Attorney, Agent, or Firm* — Oliff PLC

(57) ABSTRACT

An oscillator includes a first package that is airtightly sealed, a second package that is housed in the first package and airtightly sealed, a resonation element that is housed in the second package, and a circuit element that is housed in the first package in a state of being positioned outside the second package and electrically connected to the resonation element and has an oscillation circuit and a temperature compensation circuit. In addition, the first package includes a base having two main surfaces and a recessed portion provided on one of the main surfaces, and a lid joined to the base so as to close the opening of the recessed portion. The circuit element is attached to the base, and the second package is attached to the circuit element.

14 Claims, 12 Drawing Sheets

OSCILLATOR, ELECTRONIC APPARATUS, AND VEHICLE

BACKGROUND

1. Technical Field

The present invention relates to an oscillator, an electronic apparatus, and a vehicle.

2. Related Art

In related art, an oscillator using a quartz crystal resonation element is known. For example, In the oscillator described in International Publication No. 2017/110727 includes a substrate, a resonation element and a circuit element attached side by side on the upper surface of the substrate, a first cap joined to the substrate so as to cover the resonation elements and the circuit elements and a second cap joined to the substrate so as to cover the first cap.

In such an oscillator of International Publication No. 2017/110727, as described above, since the resonation element and the circuit element are attached to the substrate, heat from the outside is easily transmitted to the resonation element and the circuit element. That is, it is susceptible to the influence of environmental temperature, and the temperature of the resonation element and the circuit element is not stable. For this reason, for example, in a case where the oscillator of International Publication No. 2017/110727 is used as a temperature compensated oscillator, there is a problem that the temperature compensation function of the oscillator deteriorates.

SUMMARY

An oscillator according to an application example of the invention includes a first package that is airtightly sealed, a second package that is housed in the first package and airtightly sealed, a resonation element that is housed in the second package, a circuit element that is housed in the first package in a state of being positioned outside the second package and electrically connected to the resonation element and has an oscillation circuit and a temperature compensation circuit, in which the first package includes a base having two main surfaces and a recessed portion provided on one of the main surfaces, and a lid joined to the base so as to close an opening of the recessed portion, the circuit element is attached to the base, and the second package is attached to the circuit element.

In the oscillator according to the application example of the invention, it is preferable that the first package includes a first internal terminal that is disposed so as to face an inside of the recessed portion of the base and a first external terminal that is disposed on the other main surface of the base and electrically connected to the first internal terminal.

It is preferable that the oscillator according to the application example of the invention further includes a first metal bump that joins the circuit element and the base and electrically connects the circuit element and the first internal terminal.

In the oscillator according to the application example of the invention, it is preferable that the circuit element includes an active surface on which a terminal is disposed and is disposed such that the active surface faces the first internal terminal side.

It is preferable that the oscillator according to the application example of the invention further includes a first joining member that joins the circuit element and the base, and a first bonding wire that electrically connects the circuit element and the first internal terminal.

In the oscillator according to the application example of the invention, it is preferable that the circuit element includes an active surface on which a terminal is disposed and is disposed such that the active surface faces away from the first internal terminal.

In the oscillator according to the application example of the invention, it is preferable that the second package includes a second external terminal that faces an outside of the second package and is electrically connected to the resonation element.

It is preferable that the oscillator according to the application example of the invention further includes a second metal bump that joins the second package and the circuit element and electrically connects the second external terminal and the circuit element.

It is preferable that the oscillator according to the application example of the invention further includes a second joining member that joins the second package and the circuit element, and a second bonding wire that electrically connects the second external terminal and the circuit element.

In the oscillator according to the application example of the invention, it is preferable that the inside of the second package is filled with an inert gas.

In the oscillator according to the application example of the invention, it is preferable that a pressure in the first package is lower than a pressure in the second package.

In the oscillator according to the application example of the invention, it is preferable that an inside of the first package is depressurized with respect to an atmospheric pressure.

An electronic apparatus according to an application example of the invention includes the oscillator of the application example.

A vehicle according to another application example of the invention includes the oscillator of the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an oscillator, an electronic apparatus, and a vehicle of the invention will be described in detail based on embodiments shown in the accompanying drawings.

First Embodiment

First, an oscillator according to a first embodiment of the invention will be described.

Figure 1:
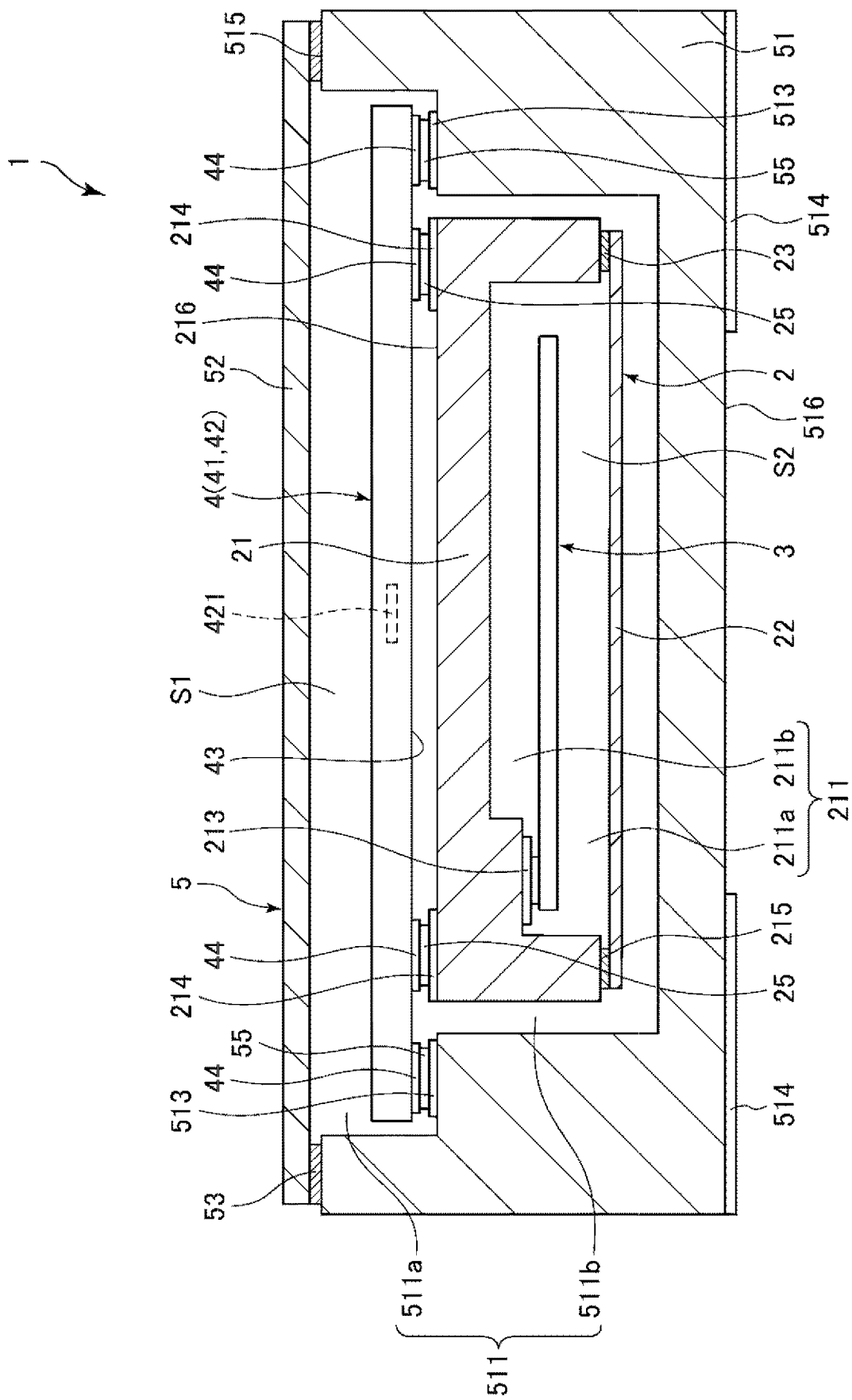
FIG. 1 is a cross-sectional view of an oscillator according to a first embodiment of the invention.
Figure 2:
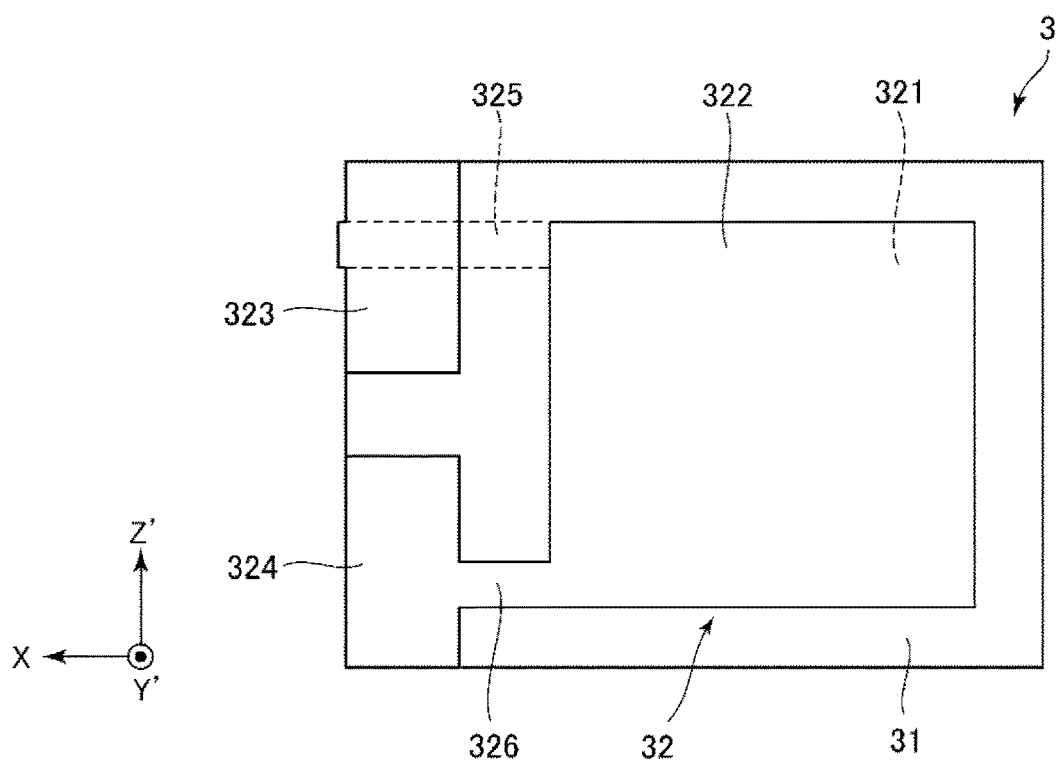
FIG. 2 is a plan view of a resonation element included in the oscillator shown in FIG. 1.
Figure 3:
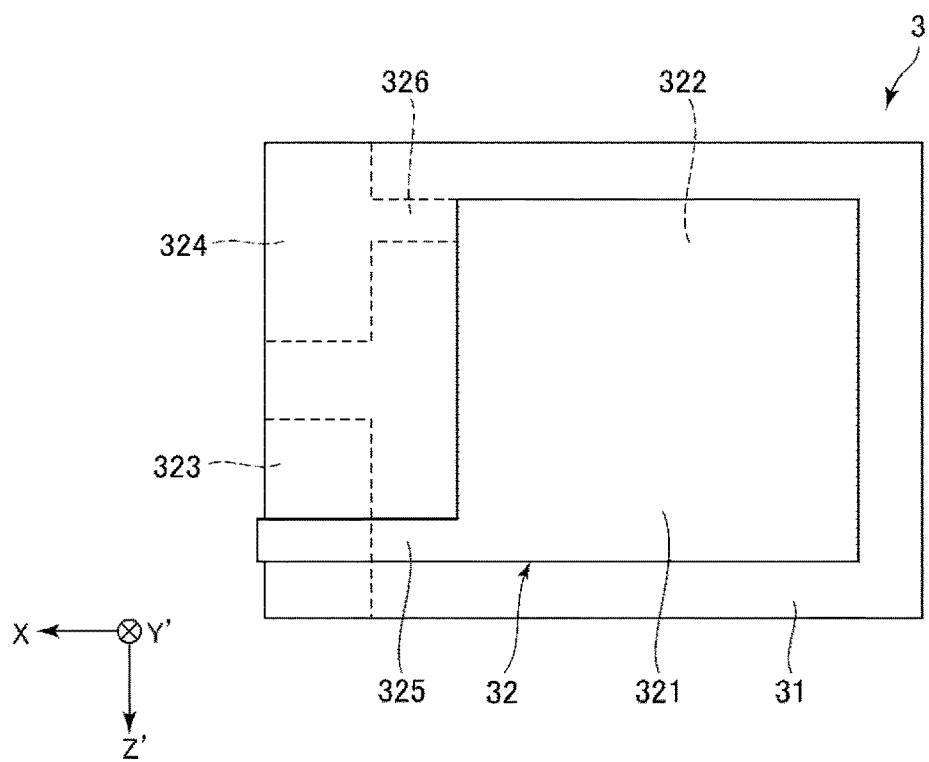
FIG. 3 is a plan view of the resonation element included in the oscillator shown in FIG. 1.
Figure 4:
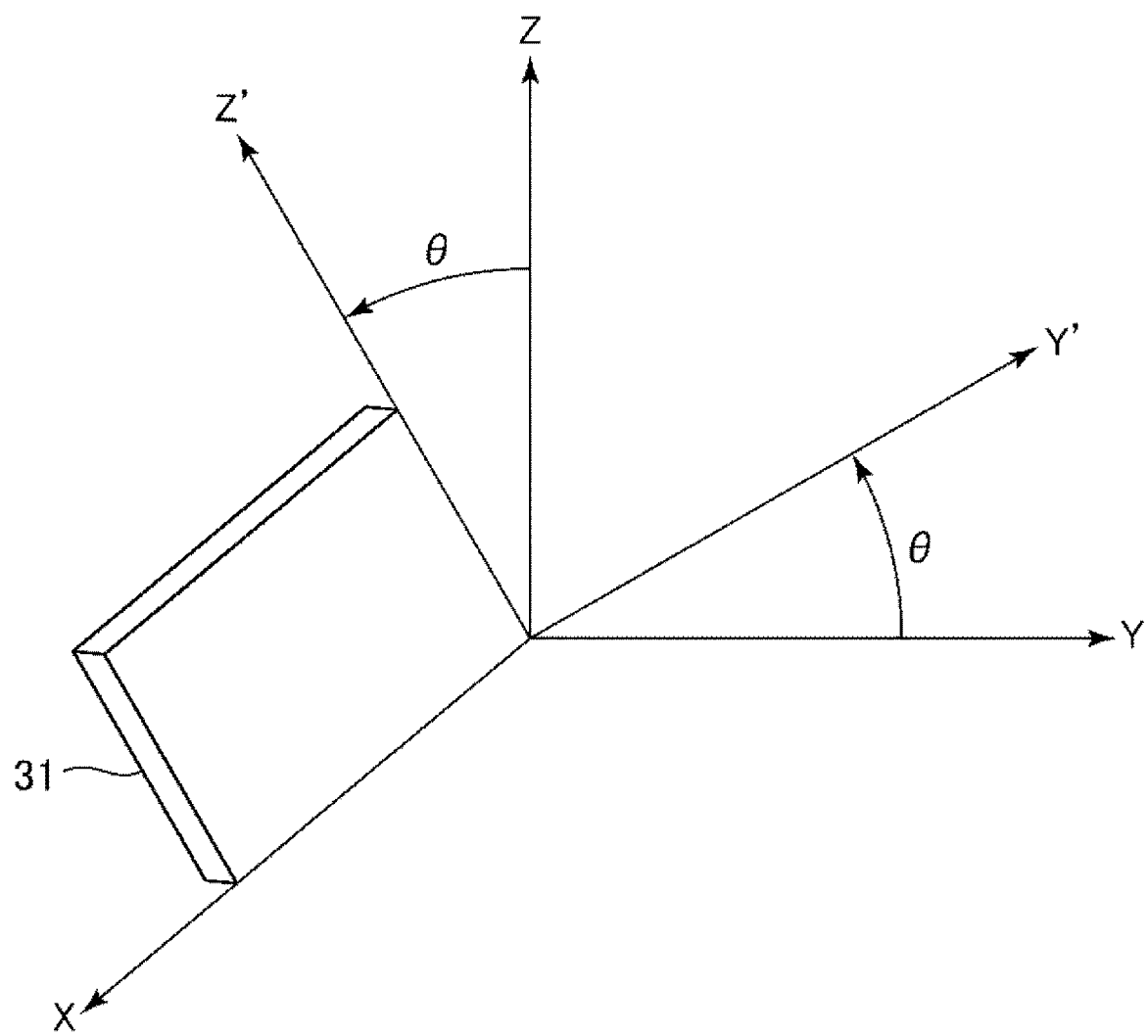
FIG. 4 is a diagram for describing a relationship between an AT-cut quartz crystal substrate and a crystal axis of quartz crystal.
Figure 5:
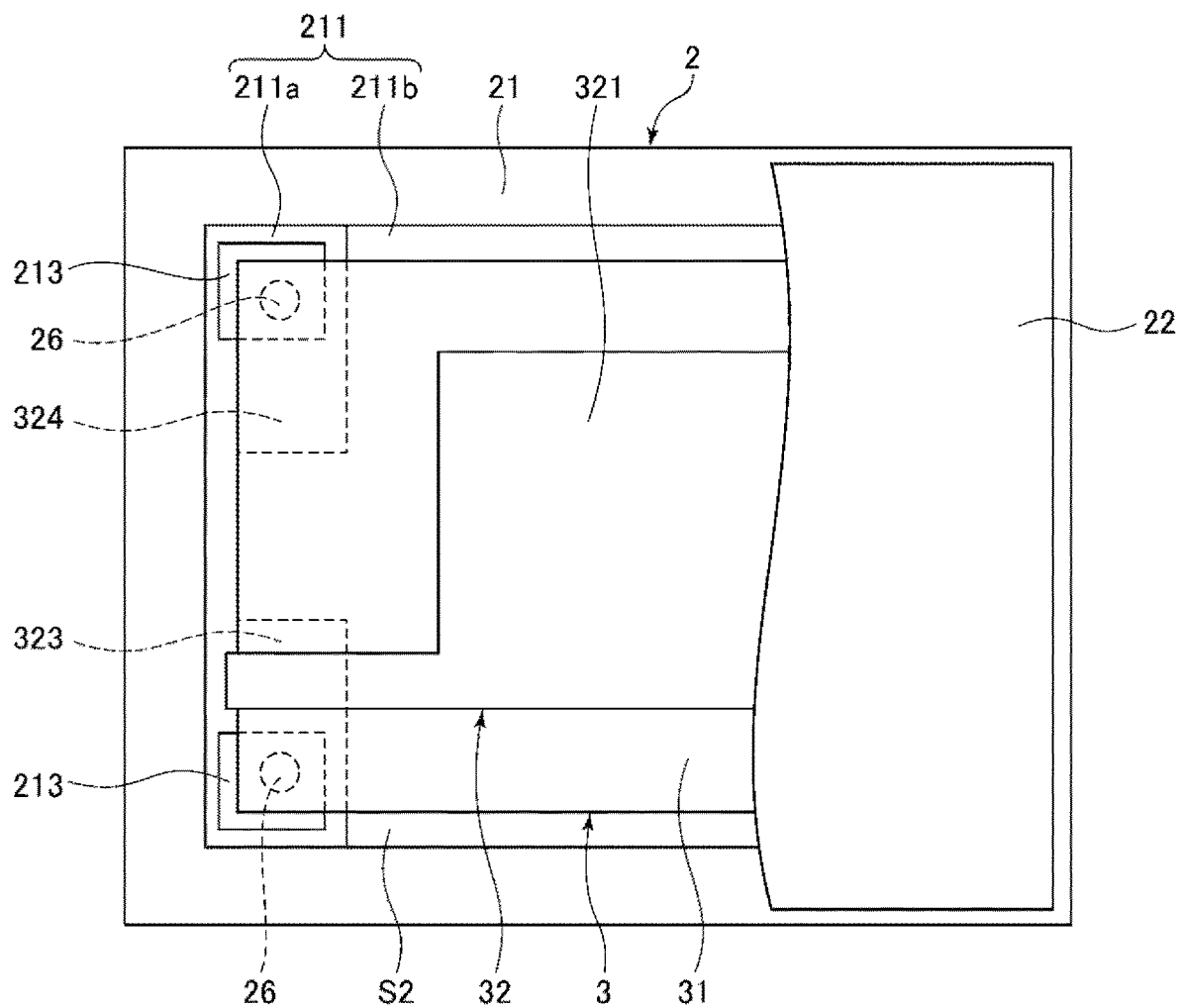
FIG. 5 is a bottom view showing the inside of an inner package of the oscillator shown in FIG. 1.

FIG. 1 is a cross-sectional view of an oscillator according to the first embodiment of the invention. FIGS. 2 and 3 are plan views of a resonation element included in the oscillator shown in FIG. 1, respectively. FIG. 4 is a diagram for describing a relationship between an AT-cut quartz crystal substrate and a crystal axis of quartz. FIG. 5 is a bottom view showing the inside of an inner package of the oscillator shown in FIG. 1. Hereinafter, for convenience of description, the upper side in FIG. 1 is also referred to as "upper" and the lower side is also referred to as "lower". In addition, hereinafter, for convenience of description, the plan view when FIG. 1 is viewed from the upper side is simply referred to as "plan view".

An oscillator 1 shown in FIG. 1 is an oscillator that generates a reference signal such as a clock signal and is particularly a temperature-compensated crystal oscillator (TCXO). Such the oscillator 1 includes a resonation element 3, an inner package 2 (a second package) housing the resonation element 3, a circuit element 4 positioned outside the inner package 2, and an outer package 5 (a first package) housing the inner package 2 and the circuit element 4. The circuit element 4 is fixed to the outer package 5, and the inner package 2 is fixed to the circuit element 4. In this way, by double-sealing the resonation element 3 with the inner package 2 and the outer package 5, external heat is less likely to be transmitted to the resonation element 3, and the temperature change of the resonation element 3 may be reduced. Therefore, it is possible to realize the temperature compensation function by the circuit element 4 with high accuracy and to obtain the oscillator 1 having a stable temperature characteristic. Hereinafter, such the oscillator 1 will be described in detail.

Outer Package

As shown in FIG. 1, the outer package 5 includes a flat base 51 having an upper surface 515 (one main surface) and a bottom surface 516 (the other main surface) opposed in a vertical direction, and a lid 52. More specifically, the outer package 5 includes a box-shaped base 51 having a recessed portion 511 that opens on the upper surface 515, the lid 52 joined to the upper surface 515 of the base 51 so as to close the opening of the recessed portion 511, and a seal ring 53 positioned between the base 51 and the lid 52 and joining the base 51 and the lid 52.

In addition, the recessed portion 511 includes a recessed portion 511a that opens on the upper surface 515 of the base 51 and a recessed portion 511b that opens on the bottom surface of the recessed portion 511a. The lid 52 has a plate shape and is joined to the upper surface 515 of the base 51 via the seal ring 53 so as to close the opening of the recessed portion 511. The seal ring 53 has a frame shape and is positioned between the upper surface 515 of the base 51 and the lid 52. The seal ring 53 is made of a metal material, and the base 51 and the lid 52 are airtightly joined by melting the seal ring 53. A storage space S1 is formed by closing the opening of the recessed portion 511 with the lid 52, and the circuit element 4 and the inner package 2 are housed in the storage space S1.

The storage space S1 is an airtight space and is in a depressurized state, for example, which is replaced with an inert gas such as nitrogen, helium, or argon. As the depressurized state, the closer to vacuum is, the more preferable it is, for example, 10 Pa or less. In this way, it is possible to reduce the heat convection generated in the storage space S1 by setting the storage space S1 in a depressurized state. Therefore, heat outside the outer package 5 is less likely to be transmitted to the inner package 2 via the storage space S1, and as a result, it is difficult for external heat to be transmitted to the resonation element 3. Therefore, the temperatures of the resonation element 3 and the circuit element 4 are stabilized. Furthermore, the temperature difference between the resonation element 3 and the circuit element 4 may also be kept small. Therefore, the temperature of the resonation element 3 may be accurately detected by a temperature sensitive element 421 of the circuit element 4, and it is possible to realize the temperature compensation function by the circuit element 4 with high accuracy and to obtain the oscillator 1 having a stable temperature characteristic. However, the atmosphere of the storage space S1 is not particularly limited and may be an atmospheric pressure, for example.

The constituent material of the base 51 is not particularly limited, but various ceramics such as aluminum oxide may be used, for example. In this case, the base 51 may be manufactured by firing the laminate of the ceramic sheets (green sheets). In addition, the constituent material of the lid 52 is not particularly limited, but various metal materials (including alloys), for example, may be used. Specifically, it is preferable that the lid 52 is a member having a coefficient of linear expansion close to that of the constituent material of the base 51. For example, in a case where the constituent material of the base 51 is ceramics as described above, it is preferable to use an alloy such as Kovar.

In addition, a plurality of internal terminals 513 are arranged on the bottom surface of the recessed portion 511a, and a plurality of external terminals 514 are arranged on a bottom surface 516 of the base 51. Each internal terminal 513 is electrically connected to the corresponding external terminal 514 via internal wiring (not shown) formed in the base 51. The number of the internal terminals 513 and the number of the external terminals 514 are not particularly limited and may be appropriately set depending on the number of terminals 44 of the circuit element 4, for example.

Circuit Element

As shown in FIG. 1, the circuit element 4 includes an active surface 43 on which a plurality of terminals 44 are arranged and is housed in the storage space S1 such that the active surface 43 faces downward (to the internal terminal 513 side). In addition, the circuit element 4 is fixed to the bottom surface of the recessed portion 511a via a plurality of metal bumps 55 (first metal bump). In addition, each metal bump 55 electrically connects the terminal 44 and the internal terminal 513. That is, the circuit element 4 and the outer package 5 are mechanically fixed and electrically connected by the plurality of metal bumps 55. As the metal bump 55, for example, a gold bump, a silver bump, a copper bump, a solder bump or the like may be used. In addition, the number of the metal bumps 55 is not particularly limited and may be appropriately set according to the number of the internal terminals 513.

Here, since substantially no outgas is generated from the metal bumps 55, the pressure in the storage space S1 may be maintained at a lower level (increase in pressure over time may be suppressed). Therefore, it is possible to reduce the heat convection generated in the storage space S1 and to effectively reduce the temperature fluctuation of the resonation element 3 due to external heat. However, the material for fixing the circuit element 4 to the base 51 is not limited to the metal bump 55, but may be a metal paste such as gold paste or silver paste, a conductive adhesive, or the like, for example.

In addition, the circuit element 4 includes an oscillation circuit 41 for oscillating the resonation element 3 to generate a frequency of a reference signal such as a clock signal and a temperature compensation circuit 42 for correcting the frequency of the reference signal generated by the oscillation circuit 41 based on the temperature of the resonation element 3. The temperature compensation circuit 42 is, for example, a circuit having a characteristic opposite to the temperature characteristic of the resonation element and is a circuit for obtaining a good temperature characteristic over a wide temperature range. The temperature compensation circuit 42 includes a temperature sensitive element 421 for detecting the temperature of the resonation element 3 and corrects the frequency of the reference signal based on the output from the temperature sensitive element 421. Here, as described above, since the inner package 2 is attached to the circuit element 4, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421, and the circuit element 4 may realize an excellent temperature compensation function.

The temperature sensitive element 421 is not particularly limited, but in the present embodiment, a temperature sensor utilizing the temperature dependence of the band gap voltage of the PN junction is used. As a result, it is easier to make the temperature sensitive element 421 in the circuit element 4, and it is possible to accurately detect the temperature of the resonation element 3.

Inner Package

As shown in FIG. 1, the inner package 2 includes a flat base 21 having a lower surface 215 and a bottom surface 216 facing vertically, and a lid 22.

More specifically, the inner package 2 includes a box-shaped base 21 having a recessed portion 211 that opens on the lower surface 215, the lid 22 joined to the lower surface 215 of the base 21 so as to close the opening of the recessed portion 211, and a seal ring 23 positioned between the base 21 and the lid 22 and joining the base 21 and the lid 22.

In addition, the recessed portion 211 includes a recessed portion 211a that opens on the lower surface 215 of the base 21 and a recessed portion 211b that opens on the bottom surface of the recessed portion 211a. The lid 22 has a plate shape and is joined to the lower surface 215 of the base 21 via the seal ring 23 so as to close the opening of the recessed portion 211. The seal ring 23 has a frame shape and is positioned between the lower surface 215 of the base 21 and the lid 22. The seal ring 23 is made of a metal material, and the base 21 and the lid 22 are airtightly joined by melting the seal ring 23. In this way, a storage space S2 is formed by closing the opening of the recessed portion 211 with the lid 22, and the resonation element 3 is housed in the storage space S2.

The storage space S2 is an airtight space and is filled with an inert gas such as nitrogen, helium, argon, or the like, for example. As a result, since the state of the storage space S2 is stabilized, the resonation characteristic of the resonation element 3 may be stabilized. However, the atmosphere of the storage space S2 is not particularly limited and may be, for example, in a depressurized state (preferably, a state closer to vacuum, for example, 10 Pa or less).

The constituent material of the base 21 is not particularly limited, but various ceramics such as aluminum oxide may be used, for example. In this case, the base 21 may be manufactured by firing the laminate of the ceramic sheets (green sheets). In addition, the constituent material of the lid 22 is not particularly limited, but various metal materials (including alloys), for example, may be used. Specifically, it is preferable that the lid 22 is a member having a coefficient of linear expansion close to that of the constituent material of the base 21. For example, in a case where the constituent material of the base 21 is ceramics as described above, it is preferable to use an alloy such as Kovar.

In addition, a plurality of internal terminals 213 are arranged on the bottom surface of the recessed portion 211a, and a plurality of external terminals 514 are arranged on a bottom surface 216 of the base 21. Each internal terminal 513 is electrically connected to a corresponding external terminal 214 via internal wiring (not shown) formed in the base 21.

Such inner package 2 is housed in the storage space S1 with the bottom surface 216 (the surface on which the external terminal 214 is disposed) of the base 21 facing upward and in a state of being positioned on the lower side of the circuit element 4. The base 21 is fixed to the active surface 43 of the circuit element 4 via a plurality of metal bumps 25 (second metal bump). In addition, the plurality of metal bumps 25 electrically connect the external terminal 214 and the terminal 44 of the circuit element 4. That is, the plurality of metal bumps 25 mechanically fix the base 21 and the circuit element 4, and the external terminal 214 and the circuit element 4 are electrically connected. As the metal bump 25, for example, a gold bump, a silver bump, a copper bump, a solder bump or the like may be used. In addition, the number of the metal bumps 25 is not particularly limited and may be appropriately set according to the number of the internal terminals 513, for example.

Here, since substantially no outgas is generated from the metal bumps 25, the pressure in the storage space S1 may be maintained at a lower level (increase in pressure over time may be suppressed). Therefore, it is possible to reduce the heat convection generated in the storage space S1 and to effectively reduce the temperature fluctuation of the resonation element 3 due to external heat. However, the material for fixing the inner package 2 to the circuit element 4 is not limited to the metal bump 25, but may be a metal paste such as gold paste or silver paste, a conductive adhesive, or the like.

Resonation Element

As shown in FIG. 1, the resonation element 3 is housed in the inner package 2. As shown in FIGS. 2 and 3, the resonation element 3 includes a resonation substrate 31 and an electrode 32 disposed on the resonation substrate 31. The resonation substrate 31 is made of a piezoelectric material, and in particular, in the embodiment, is made of quartz. As a result, the resonation element 3 having an excellent frequency temperature characteristic may be obtained as compared with other piezoelectric materials.

The piezoelectric material is not limited to quartz crystal but may be lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium sodium niobate ((K, Na) $NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or the like, for example.

The resonation substrate 31 has a thickness shear resonation mode, and in the embodiment, is formed from an AT-cut quartz crystal substrate. As shown in FIG. 4, the AT-cut quartz crystal substrate is a "rotated Y-cut quartz crystal substrate" cut along a plane obtained by rotating an XZ plane around an X axis at an angle θ (=35° 15'). Since the AT-cut quartz crystal substrate has a third-order frequency temperature characteristic, the resonation element 3 having an excellent temperature characteristic may be obtained by forming the resonation substrate 31 from the AT-cut quartz crystal substrate. Hereinafter, an Y axis and a Z axis rotated about the X axis corresponding to the angle θ are referred to as an Y' axis and a Z' axis. That is, the resonation substrate 31 has a thickness in the Y' axis direction and is spread in an XZ' plane direction.

The electrode 32 includes an excitation electrode 321 disposed on the lower surface of the resonation substrate 31 and an excitation electrode 322 disposed on the upper surface so as to face the excitation electrode 321. In addition, the electrode 32 includes a pair of pad electrodes 323 and 324 disposed on the upper surface of the resonation substrate 31, a wiring 325 for electrically connecting a pad electrode 323 and the excitation electrode 321, and a wiring 326 for electrically connecting a pad electrode 324 and the excitation electrode 322. Then, the resonation substrate 31 is subjected to thickness shear resonation by applying a drive signal (alternating voltage) between the excitation electrodes 321 and 322.

As shown in FIG. 5, such the resonation element 3 is fixed to the bottom surface of the recessed portion 211a via a pair of joining members 26. In addition, one joining member 26 electrically connects the internal terminal 213 and the pad electrode 323, and the other joining member 26 electrically connects the internal terminal 213 and the pad electrode 324.

The joining member 26 is not particularly limited as long as the joining member 26 has both conductivity and joining property, and for example, it is preferable to use metal materials such as gold (Au), silver (Ag), copper (Cu), alloys containing these metallic materials (gold braze, silver braze, copper brazes, solder, and the like), conductive adhesives (for example, a polyimide adhesive in which fine metal particles such as silver filler are dispersed), and the like.

Although the resonation element 3 has been described above, the configuration of the resonation element 3 is not limited to the above-described configuration. For example, the resonation element 3 may have a mesa shape in which the resonation region (region sandwiched between the excitation electrodes 321 and 322) of the resonation substrate 31 protrudes from the surroundings thereof, or on the contrary, may have an inverted mesa shape in which the resonation region is recessed from the surroundings. In addition, beveling for grinding the periphery of the resonation substrate 31 or convex processing with convex curved surfaces on the upper and lower surfaces may be applied. In addition, the resonation element 3 is not limited to resonation in the thickness shear resonation mode, and for example, a plurality of resonation arms may be flexural resonations (tuning fork resonations) in the in-plane direction, or the plurality of resonation arms may be flexural resonations (walking resonations) in the out-of-plane direction.

The oscillator 1 of the embodiment has been described above. As described above, such the oscillator 1 includes the outer package 5 (first package) that is airtightly sealed, the inner package 2 (second package) housed in the outer package 5 and airtightly sealed, the resonation element 3 housed in the inner package 2, and the circuit element 4 having the oscillation circuit 41 and the temperature compensation circuit 42 housed in the outer package 5 in a state of being positioned outside the inner package 2 and are electrically connected to the resonation element 3. In addition, the outer package 5 includes the base 51 having two main surfaces (the upper surface 515 and the bottom surface 516) and the recessed portion 511 provided on the upper surface 515 side, and the lid 52 joined to the base 51 so as to close the opening of the recessed portion 511. The circuit element 4 is attached to the base 51, and the inner package 2 is attached to the circuit element 4.

According to such a configuration, it is possible to sufficiently lengthen the heat transmission route from the outer package 5 to the resonation element 3. Therefore, it is difficult for external heat to be transmitted to the resonation element 3, and temperature fluctuation of the resonation element 3 due to external heat may be reduced. Therefore, it is possible to realize the temperature compensation function by the circuit element 4 with high accuracy and to obtain the oscillator 1 having stable temperature characteristics. In particular, in the embodiment, since the outer package 5 and the circuit element 4 are connected by the metal bumps 55 and the circuit element 4 and the inner package 2 are connected by the metal bumps 25, it is possible to sufficiently reduce (thin) the heat transmission route described above.

Therefore, external heat is less likely to be transmitted to the resonation element 3, and the above-described effect may be achieved more remarkably.

In addition, as described above, the outer package 5 includes the internal terminal 513 (first internal terminal) disposed facing the inside of the recessed portion 511 of the base 51 and the external terminal 514 (first external terminal) disposed on the lower surface (the other main surface) of the base 51 and electrically connected to the internal terminal 513. As a result, it is easy to electrically extract from the inside to the outside of the outer package 5 and it is possible to easily make electrical connection to the circuit element 4 and the resonation element 3 from the outside of the outer package 5.

In addition, as described above, the oscillator 1 includes the metal bumps 55 (first metal bumps) that join the circuit element 4 and the base 51 and electrically connects the circuit element 4 and the internal terminal 513. In this way, the configuration of the oscillator 1 becomes simple by making mechanical connection and electrical connection with the metal bumps 55. In addition, since substantially no outgas is generated from the metal bumps 55, the pressure in the storage space S1 may be maintained at a lower level (increase in pressure over time may be suppressed). Therefore, it is possible to reduce the heat convection generated in the storage space S1 and to effectively reduce the temperature fluctuation of the resonation element 3 due to external heat.

In addition, as described above, the circuit element 4 includes the active surface 43 on which the terminal 44 is disposed, and the active surface 43 is disposed facing the internal terminal 513 side. As a result, the terminal 44 and the internal terminal 513 are opposed to each other, and it is possible to easily perform the electrical connection between the terminal 44 and the internal terminal 513 by the metal bumps 55.

In addition, as described above, the inner package 2 includes the external terminal 214 (second external terminal) that is disposed so as to face the outside thereof and is electrically connected to the resonation element 3. As a result, it is possible to easily make electrical connection from the outside of the inner package 2 to the resonation element 3.

In addition, as described above, the inner package 2 includes the metal bumps 25 (second metal bumps) that join the inner package 2 and the circuit element 4 and electrically connects the external terminal 214 and the circuit element 4. In this way, the configuration of the oscillator 1 becomes simple by making mechanical connection and electrical connection with the metal bumps 25. In addition, since substantially no outgas is generated from the metal bumps 25, the pressure in the storage space S1 may be maintained at a lower level (increase in pressure over time may be suppressed). Therefore, it is possible to reduce the heat convection generated in the storage space S1 and to effectively reduce the temperature fluctuation of the resonation element 3 due to external heat.

In addition, as described above, the inside of the inner package 2 is filled with an inert gas. As a result, the atmosphere in the inner package 2 is stabilized and the resonation characteristic of the resonation element 3 may be stabilized.

In addition, as described above, the pressure in the outer package 5 is lower than the pressure in the inner package 2. As a result, heat convection is less likely to occur in the outer package 5, and external heat is less likely to be transmitted to the resonation element 3. In particular, in the embodiment, the inside of the outer package 5 is depressurized with respect to the atmospheric pressure. As a result, heat convection is less likely to occur in the outer package 5. Therefore, external heat is less likely to be transmitted by the resonation element 3.

Second Embodiment

Next, an oscillator according to a second embodiment of the invention will be described.

Figure 6:
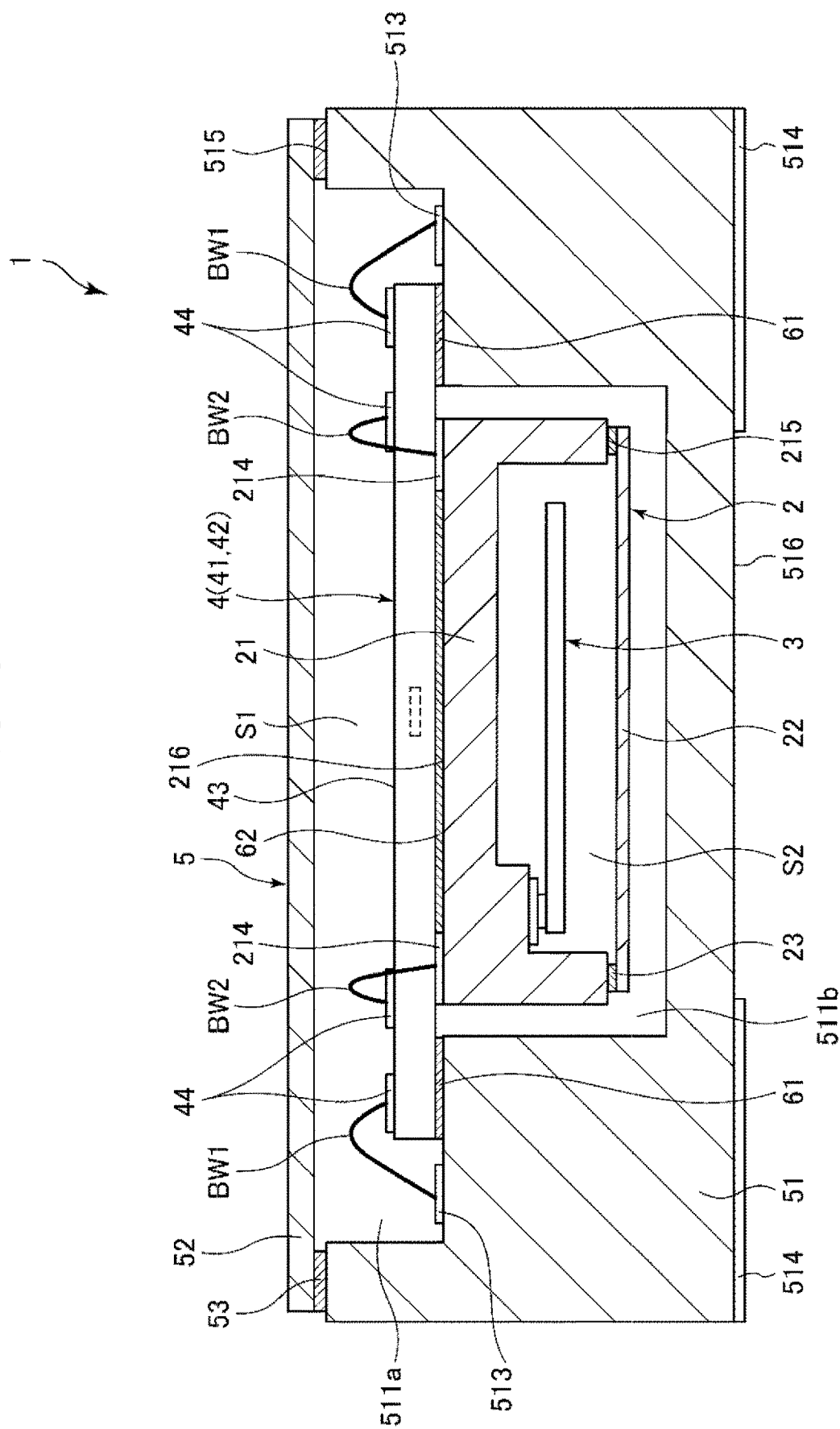
FIG. 6 is a cross-sectional view of an oscillator according to a second embodiment of the invention.
Figure 7:
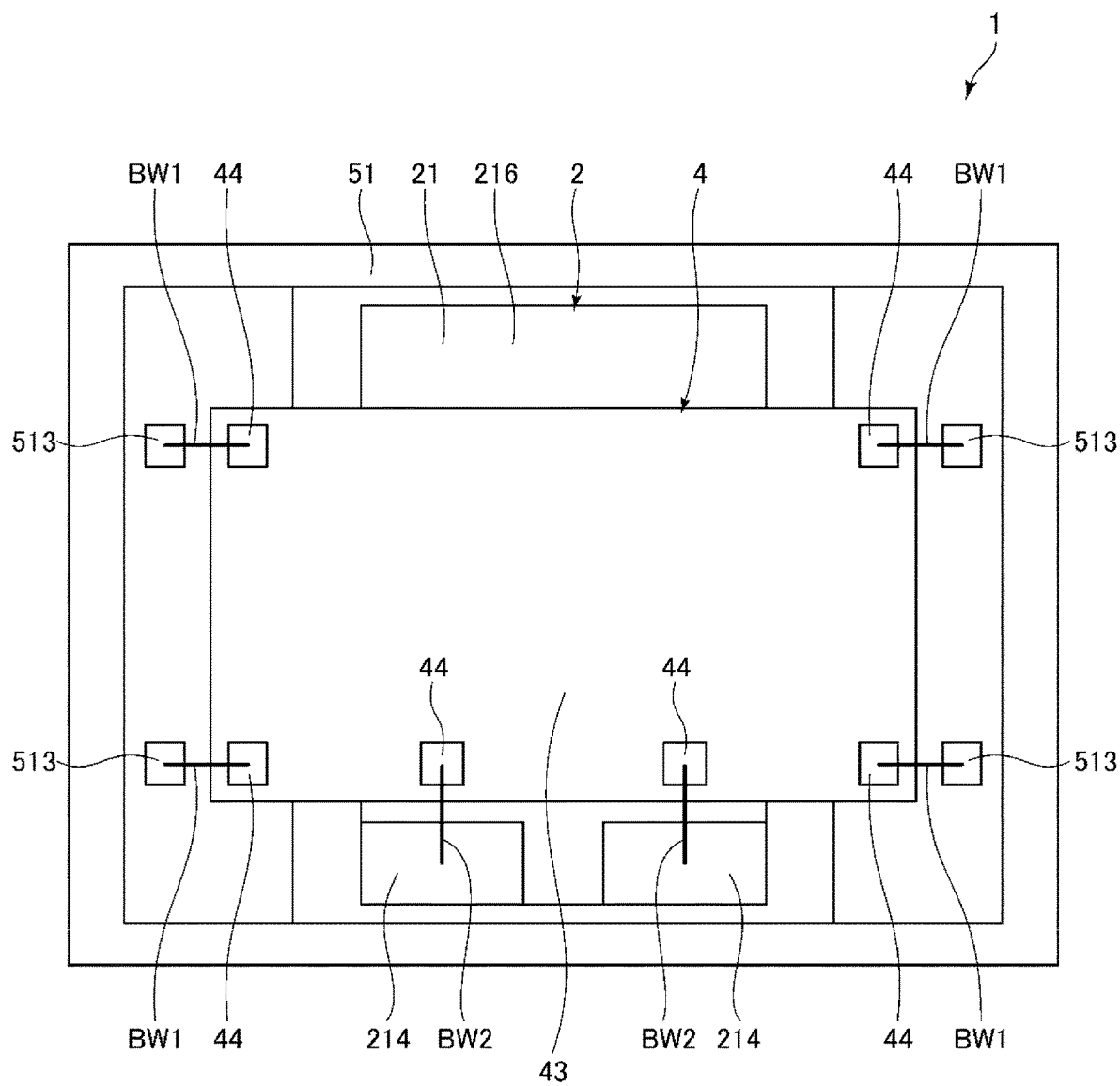
FIG. 7 is a top view of the oscillator shown in FIG. 6.

FIG. 6 is a cross-sectional view of the oscillator according to the second embodiment of the invention. FIG. 7 is a top view of the oscillator shown in FIG. 6.

Hereinafter, differences between the oscillator of the second embodiment and the above-described embodiment will be mainly described, and description of similar matters will be omitted. The oscillator of the second embodiment is similar to the oscillator of the first embodiment except that the direction of the circuit element 4 is mainly different. In FIGS. 6 and 7, the same reference numerals are given to the same configurations as those in the above-described embodiment.

As shown in FIG. 6, in the oscillator 1 of the embodiment, the circuit element 4 is housed in the storage space S1 such that the active surface 43 faces upward (opposite to the internal terminal 513). In addition, the circuit element 4 is fixed to the bottom surface of the recessed portion 511a via a joining member 61 (first joining member). In addition, the terminal 44 of the circuit element 4 and the internal terminal 513 of the base 51 are electrically connected via a bonding wire BW1 (first bonding wire). The joining member 61 is not particularly limited, and various adhesives such as an epoxy type adhesive and a silicone type adhesive, a solder, a gold braze, a silver braze, or the like may be used, for example.

In addition, the inner package 2 is fixed to the lower surface of the circuit element 4 (the main surface which is in front-to-back relationship with the active surface 43) via a joining member 62 (second joining member). In addition, as shown in FIG. 7, the external terminal 214 is disposed so as not to overlap with the circuit element 4. The external terminal 214 and the terminal 44 of the circuit element 4 are electrically connected via a bonding wire BW2 (second bonding wire). The joining member 62 is not particularly limited, and various adhesives such as an epoxy type adhesive and a silicone type adhesive, a solder, a gold braze, a silver solder, or the like may be used, for example. In addition, the joining member 62 may be made of the same material as the joining member 61 or may be a different material.

As described above, the oscillator 1 of the embodiment includes the joining member 61 (first joining member) for joining the circuit element 4 and the base 51, and the bonding wire BW1 (first bonding wire) for electrically connecting the circuit element 4 and the internal terminal 513. According to such a configuration, mechanical fixing between the circuit element 4 and the base 51 and electrical connection between the circuit element 4 and the internal terminal 513 may be easily performed.

In addition, as described above, the circuit element 4 includes the active surface 43 on which the terminal 44 is disposed, and the active surface 43 is disposed facing the side opposite to the internal terminal 513. As a result, since both the terminal 44 and the internal terminal 513 are disposed facing upward, the electrical connection may be easily performed by the bonding wire BW1.

In addition, as described above, the oscillator 1 of the embodiment includes the joining member 62 (second joining member) for joining the inner package 2 and the circuit element 4 and the bonding wire BW2 (second joining member) for electrically connecting the external terminal 214 and the circuit element 4. According to such a configuration, mechanical fixing between the inner package 2 and the circuit element 4 and electrical connection between the external terminal 214 and the circuit element 4 may be easily performed.

According to the second embodiment like this, the same effects as those of the first embodiment described above may be achieved.

Third Embodiment

Next, an oscillator according to a third embodiment of the invention will be described.

Figure 8:
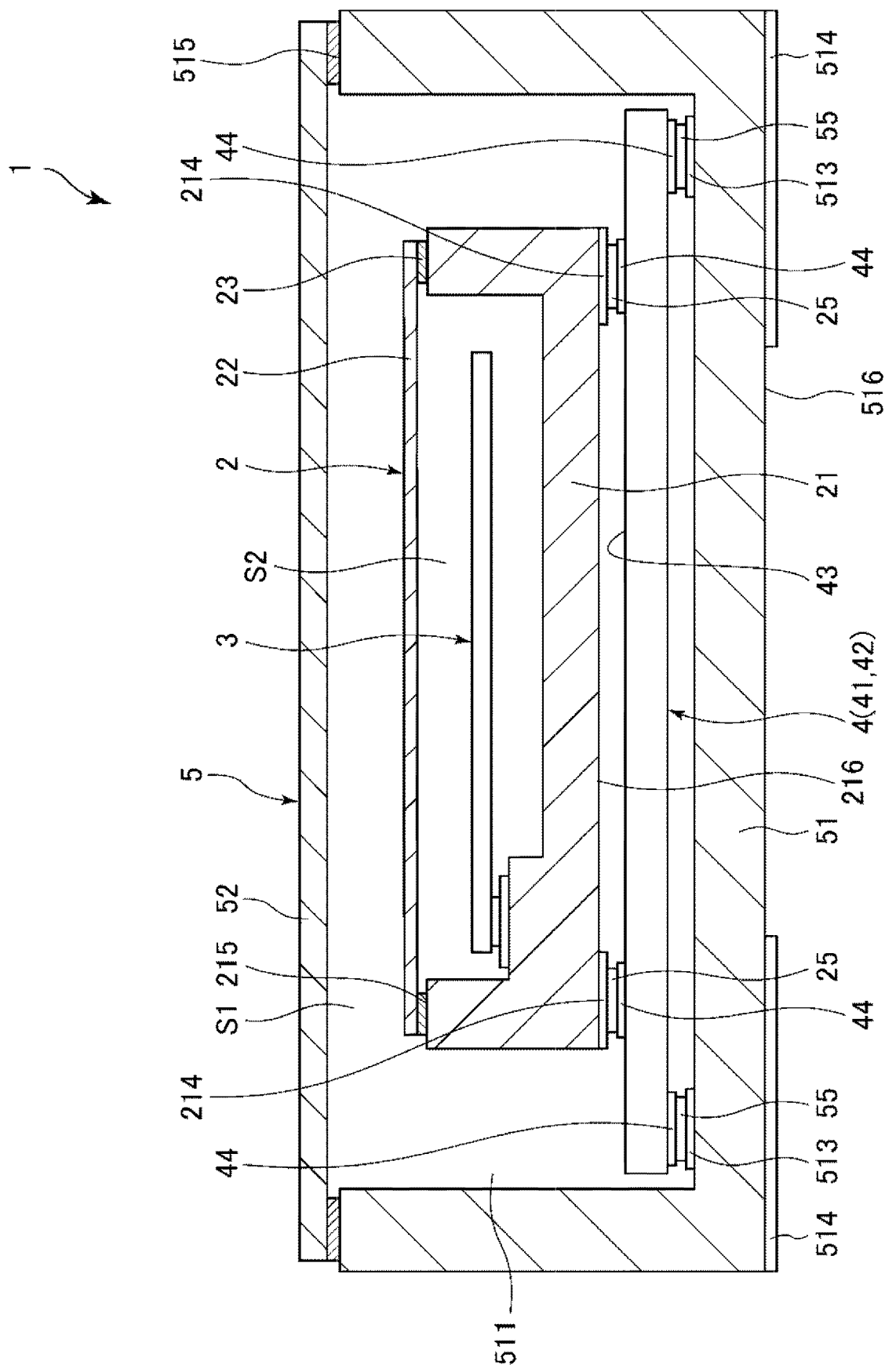
FIG. 8 is a cross-sectional view of an oscillator according to a third embodiment of the invention.

FIG. 8 is a cross-sectional view of the oscillator according to the third embodiment of the invention.

Hereinafter, differences between the oscillator of the third embodiment and the above-described embodiment will be mainly described, and description of similar matters will be omitted. The oscillator of the third embodiment is similar to the oscillator of the first embodiment except that the disposition of the circuit element and the inner package are different mainly in the storage space. In FIG. 8, the same reference numerals are given to the same configurations as in the above-described embodiment.

As shown in FIG. 8, in the oscillator 1 of the embodiment, the inner package 2 is placed on the upper surface of the circuit element 4. In addition, the circuit element 4 is fixed to the bottom surface of the recessed portion 511 via the four metal bumps 55. In addition, each metal bump 55 electrically connects the terminal 44 disposed on the lower surface of the circuit element 4 and the internal terminal 513. In addition, the inner package 2 is fixed to the upper surface of the circuit element 4 via the two metal bumps 25. In addition, each metal bump 25 electrically connects the external terminal 214 and the terminal 44 disposed on the top surface of the circuit element 4.

According to the second embodiment like this, the same effects as those of the first embodiment described above may be achieved.

Fourth Embodiment

Next, an oscillator according to a fourth embodiment of the invention will be described.

Figure 9:
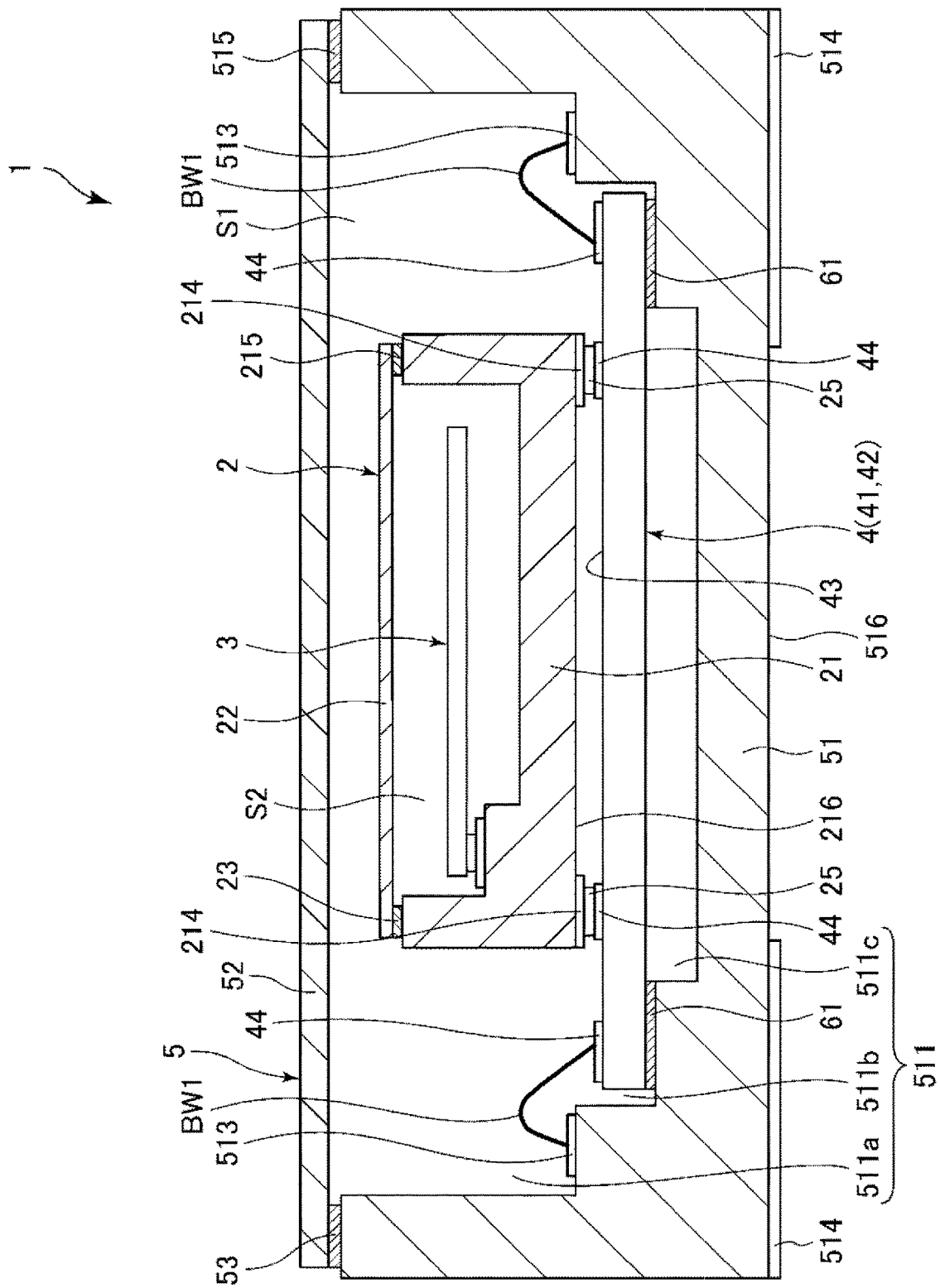
FIG. 9 is a cross-sectional view of an oscillator according to a fourth embodiment of the invention.

FIG. 9 is a cross-sectional view of the oscillator according to the fourth embodiment of the invention.

Hereinafter, differences between the oscillator of the fourth embodiment and the above-described embodiment will be mainly described, and description of similar matters will be omitted. The oscillator of the fourth embodiment is similar to the oscillator of the first embodiment except that the disposition of the circuit element and the inner package are different mainly in the storage space. In FIG. 9, the same reference numerals are given to the same configurations as in the above-described embodiment.

As shown in FIG. 9, in the oscillator 1 of the embodiment, the recessed portion 511 of the base 51 includes the recessed portion 511a that opens on the upper surface of the base 51, the recessed portion 511b that opens on the bottom of the recessed portion 511a, and a recessed portion 511c that opens on the bottom of the recessed portion 511b. The internal terminal 513 is disposed on the bottom surface of the recessed portion 511a.

In addition, the circuit element 4 is housed in the storage space S1 such that the active surface 43 faces upward. In addition, the circuit element 4 is fixed to the bottom surface of the recessed portion 511b via the joining member 61. In addition, the terminal 44 of the circuit element 4 and the internal terminal 513 of the base 51 are electrically connected via a bonding wire BW1. The joining member 61 is not particularly limited, and various adhesives such as an epoxy type adhesive and a silicone type adhesive, a solder, a gold braze, a silver braze, or the like may be used, for example.

In addition, the inner package 2 is fixed to the active surface 43 of the circuit element 4 via the two metal bumps 25. In addition, each metal bump 25 electrically connects the external terminal 214 and the terminal 44.

According to the fourth embodiment like this, the same effects as those of the first embodiment described above may be achieved.

Fifth Embodiment

Next, an electronic apparatus according to a fifth embodiment of the invention will be described.

Figure 10:
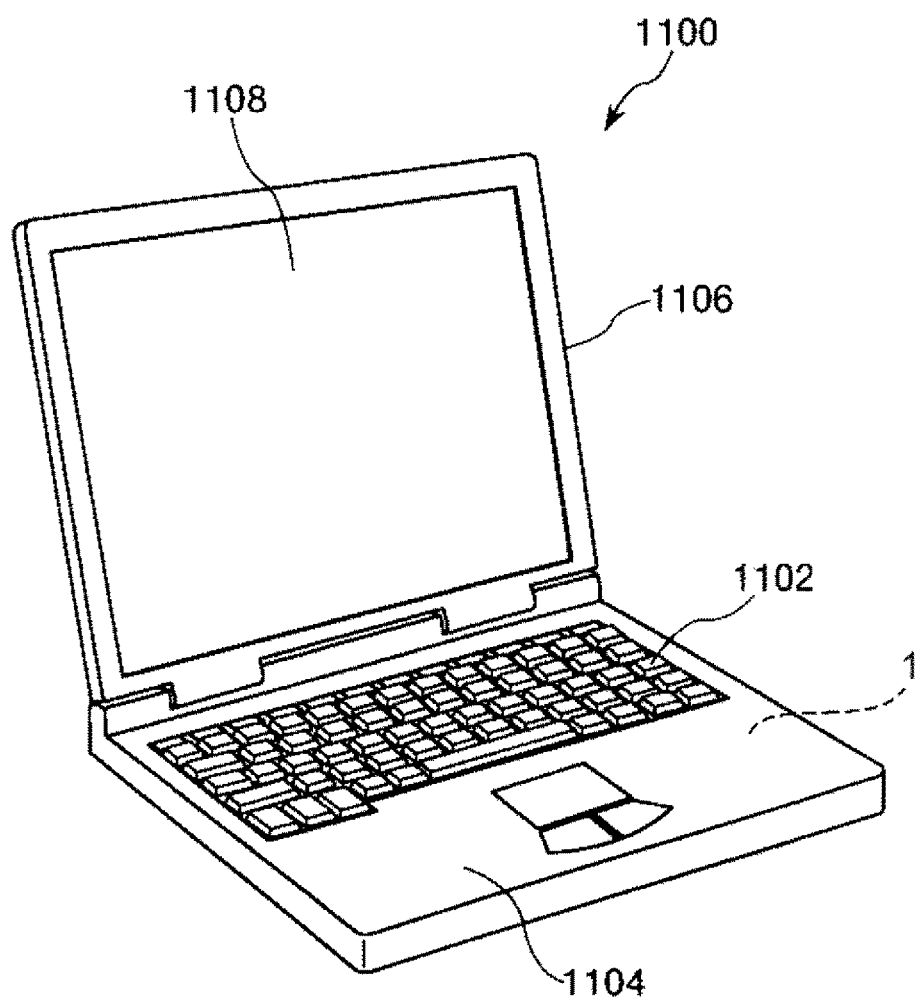
FIG. 10 is a perspective view showing an electronic apparatus according to a fifth embodiment of the invention.

FIG. 10 is a perspective view showing the electronic apparatus according to the fifth embodiment of the invention.

A mobile type (or notebook type) personal computer 1100 shown in FIG. 10 is one to which an electronic apparatus including the oscillator of the invention is applied. In this diagram, the personal computer 1100 is configured by a main body 1104 having a keyboard 1102 and a display unit 1106 having a display portion 1108, and the display unit 1106 is rotatably supported relative to the main body 1104 via a hinge structure. In addition, in the personal computer 1100, for example, the oscillator 1 used as an oscillator is built therein.

Such the personal computer 1100 (electronic apparatus) has the oscillator 1.

Therefore, it is possible to achieve the effect of the above-described oscillator 1 and to achieve high reliability.

Sixth Embodiment

Next, an electronic apparatus according to a sixth embodiment of the invention will be described.

Figure 11:
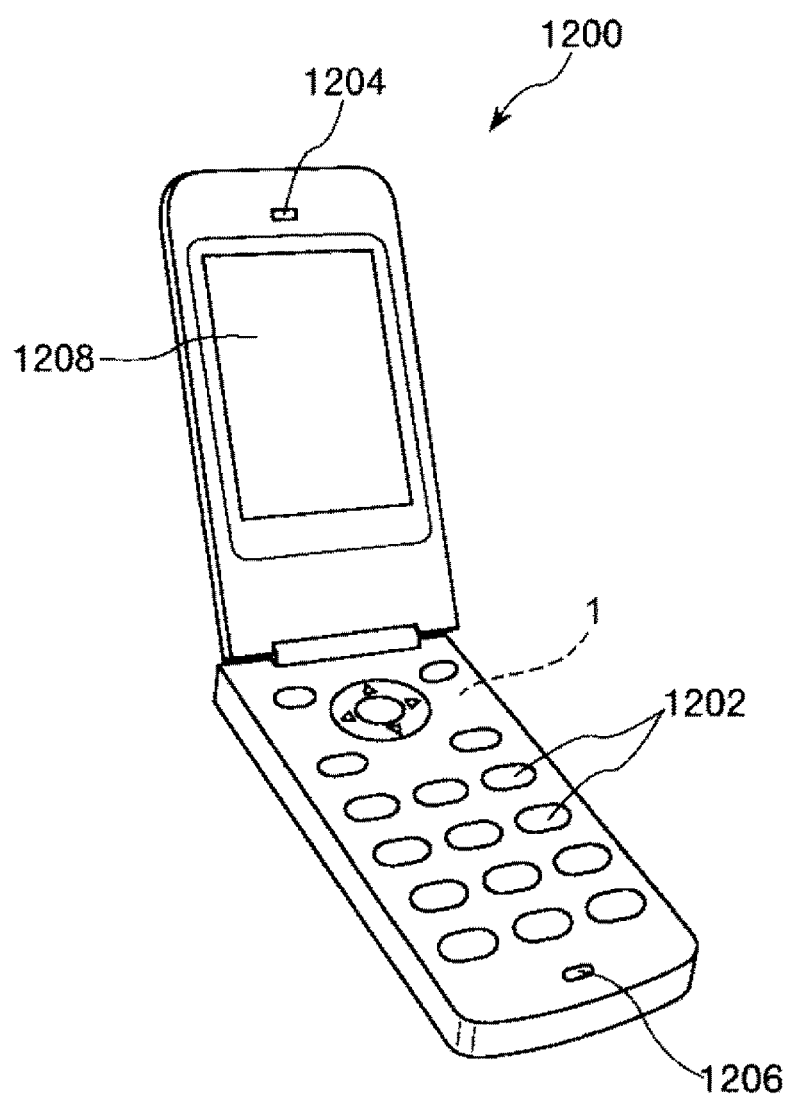
FIG. 11 is a perspective view showing an electronic apparatus according to a sixth embodiment of the invention.

FIG. 11 is a perspective view showing the electronic apparatus according to the sixth embodiment of the invention.

A mobile phone 1200 (including the PHS) shown in FIG. 11 is one to which an electronic apparatus including the oscillator of the invention is applied. The mobile phone 1200 includes an antenna (not shown), a plurality of operation buttons 1202, an earpiece 1204, and a mouthpiece 1206, and a display unit 1208 is disposed between the operation buttons 1202 and the earpiece 1204. In addition, in the mobile phone 1200, for example, the oscillator 1 used as an oscillator is built therein.

The mobile phone 1200 (electronic apparatus) as described above has the oscillator 1. Therefore, it is possible to achieve the effect of the above-described oscillator 1 and to achieve high reliability.

Seventh Embodiment

Next, an electronic device according to a seventh embodiment of the invention will be described.

Figure 12:
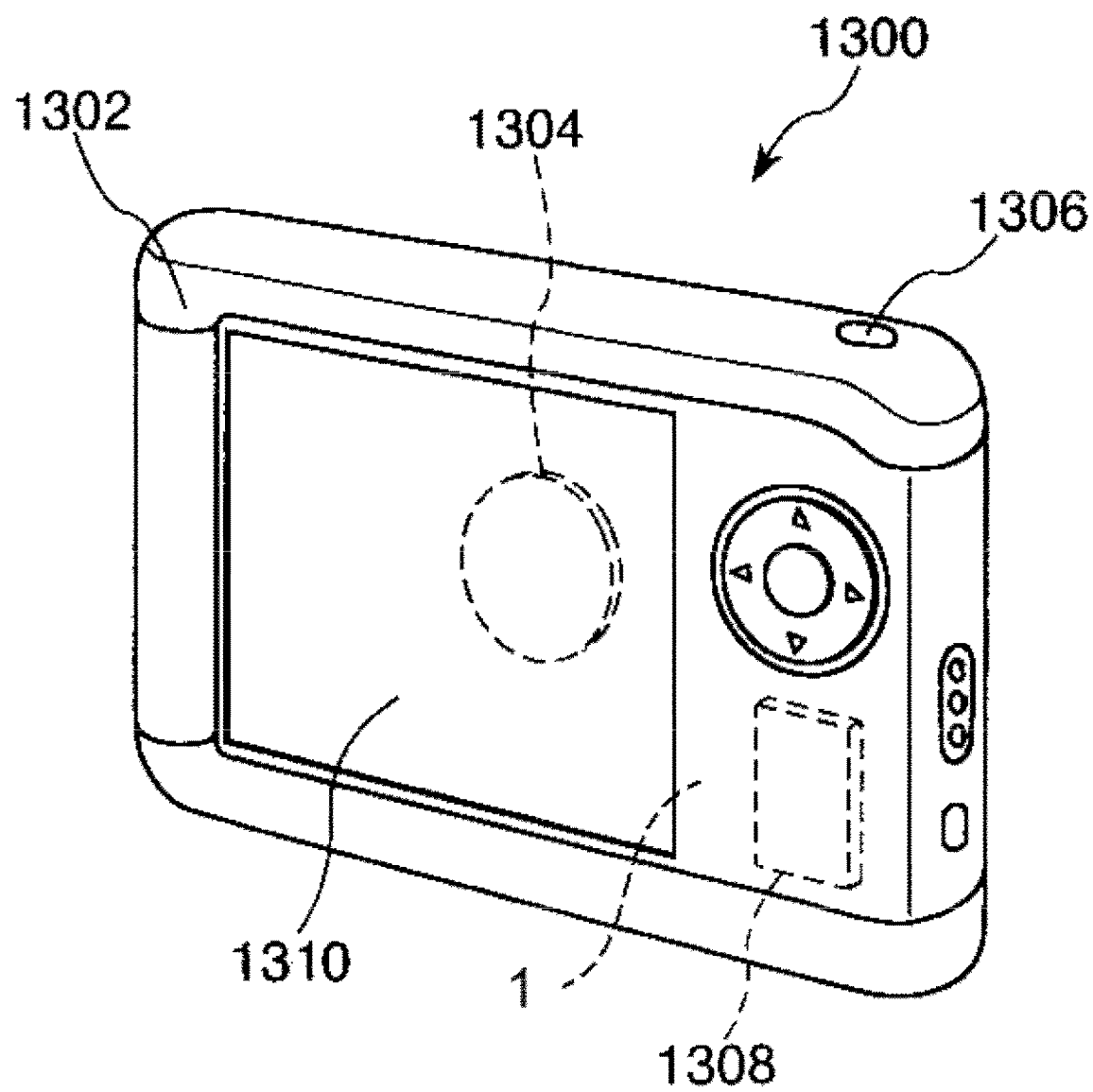
FIG. 12 is a perspective view showing an electronic apparatus according to a seventh embodiment of the invention.

FIG. 12 is a perspective view showing the electronic apparatus according to the seventh embodiment of the invention.

A digital still camera 1300 shown in FIG. 12 is one to which an electronic apparatus including the oscillator of the invention is applied. A display unit 1310 is provided on the back surface of a case (body) 1302 and is configured to perform display based on imaging signals by a CCD, and the display unit 1310 functions as a finder that displays a subject as an electronic image. In addition, a light receiving unit 1304 including an optical lens (imaging optical system) and a CCD or the like is provided on the front side (back side in the drawing) of the case 1302. When a photographer confirms the subject image displayed on the display unit 1310 and presses a shutter button 1306, the imaging signal of the CCD at that time is transferred and stored in a memory 1308. In addition, in the digital still camera 1300, the oscillator 1 used as an oscillator is built therein.

Such the digital still camera 1300 (electronic apparatus) includes the oscillator 1.

Therefore, it is possible to achieve the effect of the above-described oscillator 1 and to achieve high reliability.

In addition to the personal computer, the mobile phone, and the digital still camera of the embodiments described above, the electronic apparatus according to the invention may be applied to, for example, a smartphone, a tablet terminal, a clock (including a smart watch), an ink jet type discharging device (for example, an ink jet printer), a laptop type personal computer, a television, a wearable terminal such as an head mounted display (HMD), a video camera, a video tape recorder, a car navigation device, a pager, an electronic notebook (including a communication function), an electronic dictionary, a calculator, an electronic game machine, a word processor, a workstation, a TV phone, a security TV monitor, electronic binoculars, a POS terminal, medical equipment (for example, electronic clinical thermometer, blood pressure monitor, blood glucose meter, electrocardiogram measuring device, ultrasonic diagnostic device, electronic endoscope), a fish finder, various measuring instruments, mobile terminal base station equipment, instruments (for example, instruments of vehicles, aircraft, ships), a flight simulator, a network server, and the like.

Eighth Embodiment

Next, a moving body according to an eighth embodiment of the invention will be described.

Figure 13:
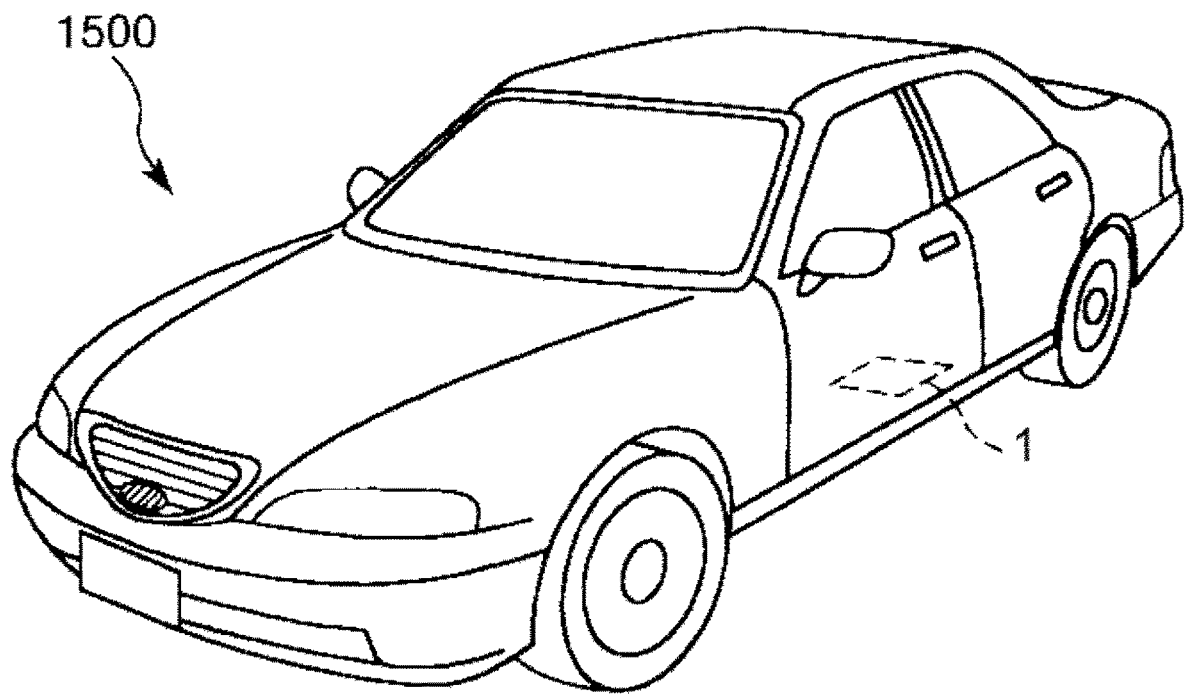
FIG. 13 is a perspective view showing a vehicle according to an eighth embodiment of the invention.

FIG. 13 is a perspective view showing a vehicle according to the eighth embodiment of the invention.

An automobile 1500 shown in FIG. 13 is a vehicle to which a moving object equipped with the oscillator according to the invention is applied. In the automobile 1500, for example, the oscillator 1 used as an oscillator is built therein. The oscillator 1 may be widely applied to, for example, keyless entry, immobilizer, car navigation system, car air conditioner, anti-lock brake system (ABS), airbag, tire pressure monitoring system (TPMS), engine control, battery monitor for hybrid cars and electric cars, and electronic control unit (ECU) such as a vehicle body attitude control system.

Such the automobile 1500 (moving object) includes the oscillator 1. Therefore, it is possible to achieve the effect of the above-described oscillator 1 and high reliability.

The moving object is not limited to the automobile 1500 but may also be applied to unmanned airplanes such as an airplane, a ship, an automated guided vehicle (AGV), a biped walking robot, a drone, and the like.

The oscillator, the electronic apparatus, and the vehicle according to the invention have been described based on the illustrated embodiments, but the invention is not limited thereto, and the configuration of each portion may be replaced with an arbitrary configuration having the same function. In addition, other optional components may be added to the invention. In addition, the invention may be a combination of arbitrary two or more configurations (features) of the above embodiments.

Figure 14:
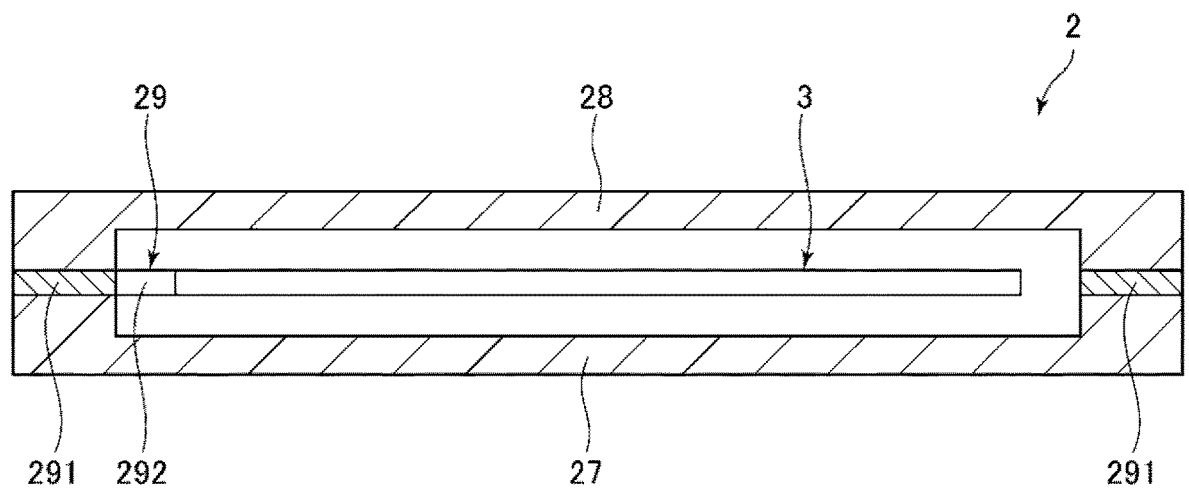
FIG. 14 is a cross-sectional view showing a modification example of the inner package.

In addition, in the embodiment described above, the inner package 2 is configured with the base 21 and the lid 22, but the inner package 2 is not limited thereto. For example, as shown in FIG. 14, the inner package 2 may include a lower substrate 27, an upper substrate 28, and an intermediate substrate 29 sandwiched between the lower substrate 27 and the upper substrate 28, and the resonation element 3 may be built in the intermediate substrate 29. In this case, the intermediate substrate 29 has a frame shape and may include a frame shaped portion 291 sandwiched between the lower substrate 27 and the upper substrate 28, the resonation element 3 formed inside the frame-shaped portion 291, and a connecting portion 292 connecting the frame-shaped portion 291 and the resonation element 3. The lower substrate 27, the upper substrate 28, and the intermediate substrate 29 may each be formed from a quartz crystal substrate.

The entire disclosure of Japanese Patent Application No. 2018-035890, filed Feb. 28, 2018 is expressly incorporated by reference herein.

What is claimed is:

1. An oscillator comprising:
   a first package that is airtightly sealed;
   a second package that is housed in the first package and airtightly sealed;
   a resonation element that is housed in the second package; and
   a circuit element that is housed in the first package in a state of being positioned outside the second package and electrically connected to the resonation element and has an oscillation circuit and a temperature compensation circuit,
   wherein the first package includes
      a base having two main surfaces and a recessed portion provided on one of the main surfaces, and
      a lid joined to the base so as to close an opening of the recessed portion,
   the circuit element is attached to the base, and
   the second package is attached to the circuit element.

2. The oscillator according to claim 1,
   wherein the first package includes
      a first internal terminal that is disposed so as to face an inside of the recessed portion of the base, and
      a first external terminal that is disposed on the other main surface of the base and electrically connected to the first internal terminal.

3. The oscillator according to claim 2, further comprising:
   a first metal bump that joins the circuit element and the base and electrically connects the circuit element and the first internal terminal.

4. The oscillator according to claim 3,
   wherein the circuit element includes an active surface on which a terminal is disposed and is disposed such that the active surface faces the first internal terminal side.

5. The oscillator according to claim 2, further comprising:
   a first joining member that joins the circuit element and the base; and
   a first bonding wire that electrically connects the circuit element and the first internal terminal.

6. The oscillator according to claim 5,
   wherein the circuit element includes an active surface on which a terminal is disposed and is disposed such that the active surface faces away from the first internal terminal.

7. The oscillator according to claim 1,
   wherein the second package includes a second external terminal that faces an outside of the second package and is electrically connected to the resonation element.

8. The oscillator according to claim 7, further comprising:
   a second metal bump that joins the second package and the circuit element and electrically connects the second external terminal and the circuit element.

9. The oscillator according to claim 7, further comprising:
   a second joining member for joining the second package and the circuit element; and
   a second bonding wire that electrically connects the second external terminal and the circuit element.

10. The oscillator according to claim 1,
    wherein an inside of the second package is filled with an inert gas.

11. The oscillator according to claim 1,
    wherein a pressure in the first package is lower than a pressure in the second package.

12. The oscillator according to claim 11,
    wherein an inside of the first package is depressurized with respect to an atmospheric pressure.

13. An electronic apparatus comprising:
the oscillator according to claim 1.
14. A vehicle comprising:
the oscillator according to claim 1.

* * * * *